United States Patent [19]
Berger et al.

[11] Patent Number: 5,126,953
[45] Date of Patent: Jun. 30, 1992

[54] PRINTED CIRCUIT BOARD ASSEMBLY TESTER

[76] Inventors: James K. Berger, 29979 Harvester Rd., Malibu, Calif. 90265; Mark A. Stalzer, 15393 Bambi Ct., Moorpark, Calif. 93021

[21] Appl. No.: 643,500

[22] Filed: Jan. 22, 1991

Related U.S. Application Data

[63] Continuation-in-part of Ser. No. 234,604, Aug. 22, 1988, abandoned, which is a continuation-in-part of Ser. No. 879,410, Jun. 27, 1986, abandoned.

[51] Int. Cl.⁵ .............................................. G01R 27/00
[52] U.S. Cl. .................................... 364/579; 324/73.1
[58] Field of Search ............... 371/25, 23; 324/73 PC, 324/73 AT, 73 R, 158 F, 158 P, 73.1; 364/580, 579

[56] References Cited

U.S. PATENT DOCUMENTS

| | | | |
|---|---|---|---|
| 3,805,243 | 4/1974 | Boisvert, Jr. | 364/900 |
| 4,459,693 | 7/1984 | Prang et al. | 371/22.6 |
| 4,481,627 | 11/1984 | Beauchesne et al. | 371/22.6 |
| 4,517,512 | 5/1985 | Petrich et al. | 371/22.1 |
| 4,565,966 | 1/1986 | Burr et al. | 324/579 |

OTHER PUBLICATIONS

"Automated Board Testing: Coping with Complex Circuits", Tulloss, IEEE Spectrum Jul. 1983 pp. 38-43.
"Fault Diagnosis of Analog Circuits", Bandler and Salama, pp. 1279-1325, Proceedings of the IEEE, vol. 73, No. 8, Aug. 1985.

*Primary Examiner*—Parshotam S. Lall
*Assistant Examiner*—S. A. Melnick

[57] ABSTRACT

Testing apparatus for assembled printed circuit boards to assure that all the component values are correct and that all the components have been correctly inserted into the board. The testing apparatus performs its testing function without the need for physical guarding, and it operates on node oriented complex-Valued Admittance measurements. The testing apparatus includes a computer which translates the measurements into component data by solving only linear equations.

5 Claims, 14 Drawing Sheets

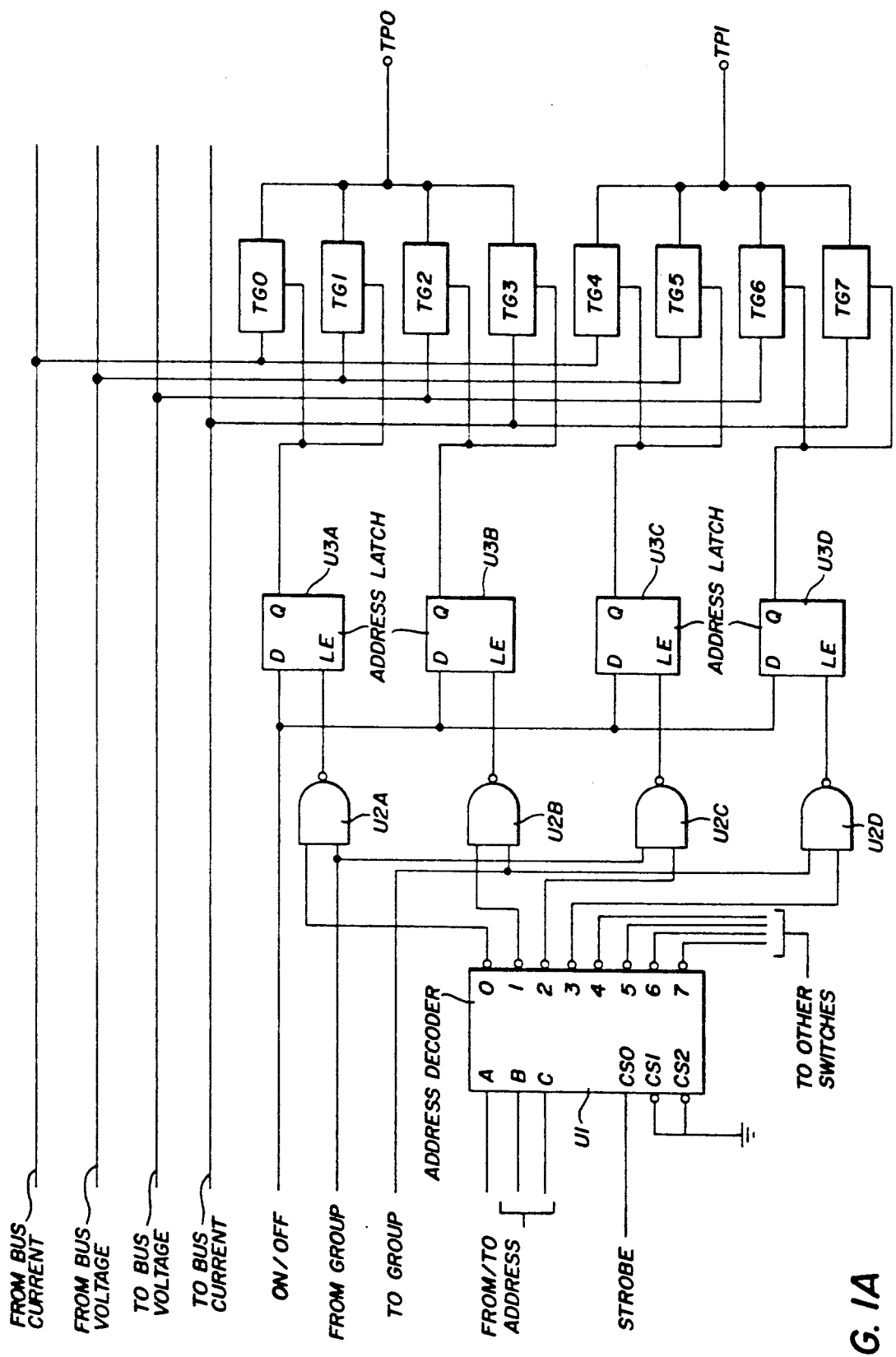
FIG. IA  SWITCH MATRIX-12

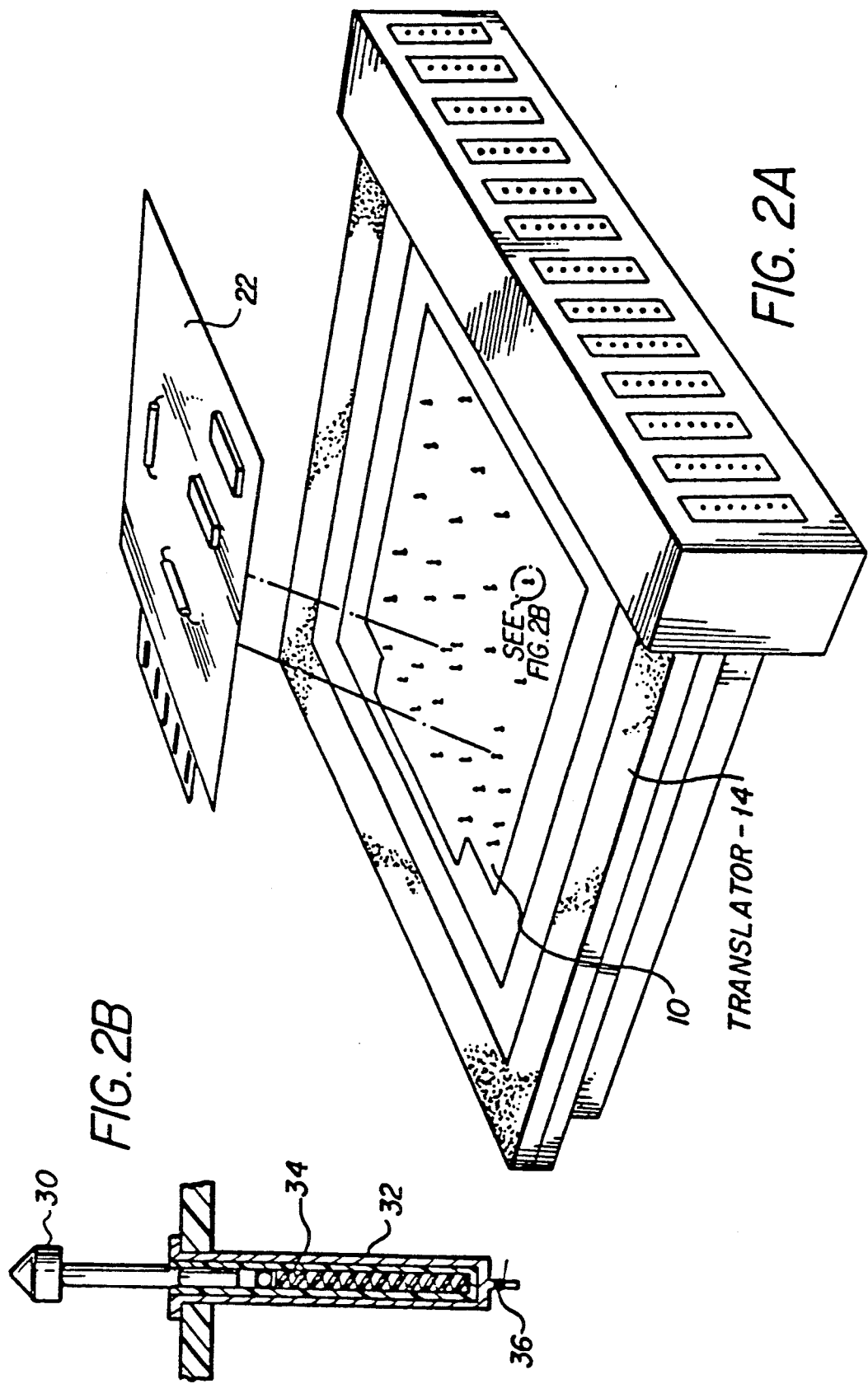

PRINTED CIRCUIT BOARD ASSEMBLY TESTER

This application is a Continuation-In-Part of Copending application Ser. No. 234,604 filed Aug. 22, 1988, now abandoned, which in turn is a Continuation-In-Part of Copending application Ser. No. 879,410 filed Jun. 27, 1986, now abandoned.

BACKGROUND OF THE INVENTION

There are in general three types of printed circuit board testers in the prior art, namely, bare board testers, in-circuit testers, and functional testers. The bare board testers as their name implies merely test the boards themselves prior to assembly. These testers are the least expensive, requiring the least programming, and they are the fastest acting and are capable of finding a high percentage of possible board defects. In-circuit testers test the fully assembled boards. These in-circuit testers are more expensive, slower, and require more extensive programming than the bare board testers. In-circuit testers find a small percentage more faults than bare board testers, because they test the components as well as the connections between the components. Functional testers typically test the circuit boards through their edge connectors. They are roughly equivalent to in-circuit testers in initial cost but may be more difficult to program. Functional testers find a different class of faults than bare board and in-circuit testers because they look for functional failures rather than component failures.

Recently, a tester has appeared in the prior art which is commonly referred to as a manufacturing defects tester. The manufacturing defects tester tests an assembled printed circuit board, primarily to assure that all of the components are the correct ones and that all of the components have been correctly inserted into the board. This tester also tests the connections between the various components, and makes parametric tests on some of the components, particularly resistors. The manufacturing defects tester is attractive because testing for assembly defects is potentially much faster and less costly than in-circuit or functional testing.

As pointed out in U.S. Pat. No. 4,538,104, the General Electric Company introduced the first in-circuit tester over thirty years ago. The in-circuit tester was designed to analyze the individual components in an electrical network. A particular fixture formed the basis for in-circuit testing. This fixture, known as a "Bed-Of-Nails", generally included spring probes projecting out its top, and the printed circuit board under test was set on top of the fixture. The fixture was designed such that a space existed between the bottom and top of the fixture, and an apparatus for drawing a vacuum in that space was connected thereto. Then, a vacuum was applied to the circuit board through the penetrations for the spring probes drawing the circuit board down against and making electrical contact with the spring probes. The spring probes were electrically connected by circuit wiring to an in-circuit electric analyzer which performed a circuit analysis upon the vacuum held circuit board.

A typical electronic circuit consists of components and interconnects. Components have two or more leads, and for the purposes of this specification, are limited to passive-linear devices. Examples are resistors, capacitors, and inductors. Interconnects convey electrical energy and potential between component leads. Examples of interconnects are wires and printed circuit board traces. A set of interconnected component leads is called a circuit node. A connectivity list defines all the nodes for a given electronic circuit.

A drawback of all the prior art in-circuit testers is the need for physical guarding. For electrical reasons, components embedded in electronic circuits cannot be measured accurately without some form of guarding to isolate the components under test from other parallel components. In the prior art in-circuit testing machines, physical guarding is used, as mentioned above. Guard pins must be assigned by engineers or other highly trained personnel. Up to the present, computer programs to assign guard pins have not been completely successful. It is physical guarding which causes present day in-circuit testers to require complex programming, and to be difficult to operate.

An important feature of the tester of the present invention is that it does not require physical guarding. Instead, the computer incorporated into the tester of the invention generates and accepts a test program which is a matrix describing the connectivity of the entire electronic circuit.

The computer inverts the matrix giving a linear transformation from node-oriented admittance measurements to component values. Given the measurements, component values can be computed using matrix multiplication and checked against expected values.

Another important feature is the ability of a computer included in the tester of the present invention to generate the test program, i.e., construct the matrix based solely on a connectivity list and component list description. The connectivity may be self-learned, and the component list description is a clerical function entered by an unskilled operator. Therefore, no actual programming need be done, and the tester can be operated without the need for engineers or programmers.

In other words, the physical guarding used in the prior art in-circuit testers diverts unwanted currents away from the measurements. The tester of the present invention uses mathematical rather than physical guarding and computes the value of the unwanted current in the measurement and mathematically subtracts that value from the value of the wanted current to arrive at the desired result. The process is carried out entirely by computer in the tester of the invention, and it does not require highly trained personnel. In addition to eliminating the main expense and difficulty in component measurement of the prior art in-circuit testers, the mathematical guarding utilized in the tester of the present invention results in increased accuracy. Of course, the actual mathematics may be implemented in terms of currents, voltages, impedances, or admittances without departing from the concept of the invention.

The term "mathematical guarding" as used in this specification is a technique for computing the values of passive-linear components in an arbitrary electronic circuit using only complex-valued admittance measurements made between defined sets of circuit nodes. There are two forms of mathematical guarding which select slightly different sets of nodes. The precise selection of nodes is given by Algorithms 1-3, which are set forth subsequently in this specification.

Each circuit node must be probed in at least one location. Such a probed location is sometimes called a (test) point or pin. Each test point has a unique number, or address, used for identification. For the current invention, it is typical to probe all component leads on every node, although this is not necessary. One test point per node is sufficient.

For the first form of mathematical guarding, the connectivitiy and component description defines the name of each node and the number of the test point that probes the node, e.g. (node "30a" 1). For the second form of mathematical guarding, a user language (program) defines the name of each component and the numbers of the test points that probe the component's leads, e.g. (component "R1" 1 2).

The use of the designation "Manufacturing Defects Tester" to describe the type of tester with which the present invention is concerned is not really appropriate because the syntax is incorrect. The tester of the invention does not test defects, rather, it tests an assembled board to determine defects. A better designation for the tester of the invention would be "Board Assembly Tester", and that designation will be used in the following description to identify the tester of the invention.

Presently available manufacturing defects testers are predominantly low cost machines, and a small test point count is common. Accordingly, one of the objectives of the board assembly tester of the present invention is to provide a large test point count to permit full connectivity testing and universal grid fixturing.

Other objectives of the present invention are to provide a board assembly tester which includes a complete self-learn capability requiring no operator input except a component list; which uses mathematical rather than physical guarding; which has extremely high speed and high throughput; and which has the ability to test connectivity completely, to make accurate parametric measurements of resistors, capacitors and inductors, and to test diodes and transistors for function and integrated circuits for correct type and correct insertion; and which has the ability with no programming except a component list entry, to test assembled boards and to find a higher percentage of all possible defects than any of the prior art testers.

BRIEF DESCRIPTION OF THE DRAWINGS

FIG. 1A is a logic diagram of a portion of a switch matrix included in the tester of FIG. 1;

FIG. 2A is a perspective schematic showing of certain components included in the printed circuit board assembly tester of FIG. 1;

FIG. 2B is a side sectional view of one of a multiplicity of spring-biased probes used in the tester of FIG. 2A;

DETAILED DESCRIPTION OF THE ILLUSTRATED EMBODIMENT

Figure 1:
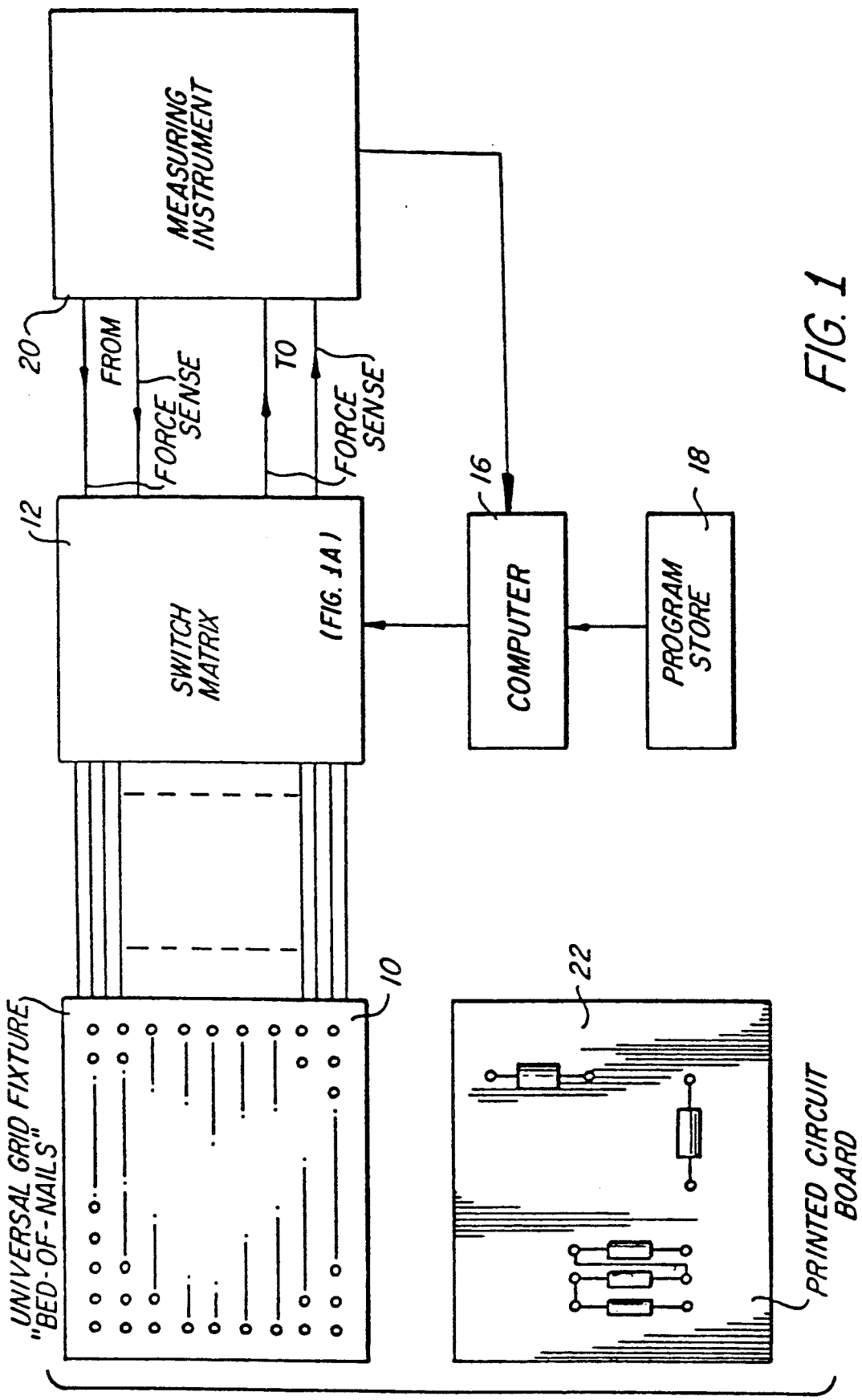
FIG. 1 is a block diagram of the printed circuit board assembly tester of the invention in one of its embodiments.

As shown in FIG. 1, the tester of the invention includes a universal grid fixture 10 of the "bed of nails" type described in U.S. Pat. No. 4,538,104. The fixture 10 is connected to a switch matrix 12 (FIG. 1A). The switch matrix is controlled by a computer 16 which is programmed from a program store 18 to serve as a control means for switch matrix 12 to cause the switch matrix selectively to connect the "nails" of fixture 10 to a measuring instrument 20. The computer also receives the measurement data from the measuring instrument.

A printed circuit board 22 to be tested is set over a translator 14 (FIG. 2A) to be connected to the "nails" of grid fixture 10, in a manner similar to that described in U.S. Pat. No. 4,538,104. The translator is equipped with a plurality of rigid pins which contact corresponding "nails" of grid fixture 10.

The grid fixture 10, translator 14 and the circuit board under test 22 are shown schematically in FIG. 2A. Each "nail" of the universal grid fixture 10, as shown in FIG. 2B, is in the form of a spring-loaded probe 30 which is slidably received in a socket 32, and which is biased to its extended position by a spring 34. A lead is connected to the probe through the socket by a wire wrap connection 36.

The pins of the translator 14 are caused by the pressure of spring probes 30 of grid fixture 10 to contact various test points on the board 22 during a test. The pins are guided by holes in the translator so that each pin lines up with a circuit node on the board 22. The translator forms a physical interface between the grid fixture 10 and the board under test.

Figure 3:
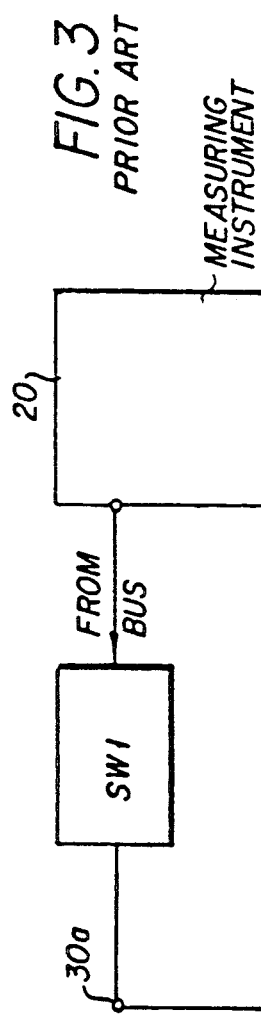
FIG. 3 is a block diagram of the basic in-circuit tester of the prior art.

The basic circuit for the prior art in-circuit tester is shown in FIG. 3. In FIG. 3, two of the test probes 30a and 30b contact corresponding nodes on the circuit board 22 to enable the tester to measure the resistance of a resistor R connected between the nodes. Accordingly, the switch matrix 12 of FIG. 1 is programmed so that at a particular time in the testing process switches SW1 and SW2 are closed. This enables the measuring instrument 20 to cause a current to flow through the resistor R and produce a voltage drop across the resistor. The measuring instrument then measures the voltage drop across the resistor and computes the value of its resistance.

However, in the actual test equipment, the switches, such as SW1 and SW2 are transistors, and these transistors have an internal resistance in a range, for example, of 10-50 ohms. Accordingly, in the circuit of FIG. 3, errors are created in the measurement of the resistance of resistor R due to the internal resistance of switches SW1 and SW2.

Figure 4:
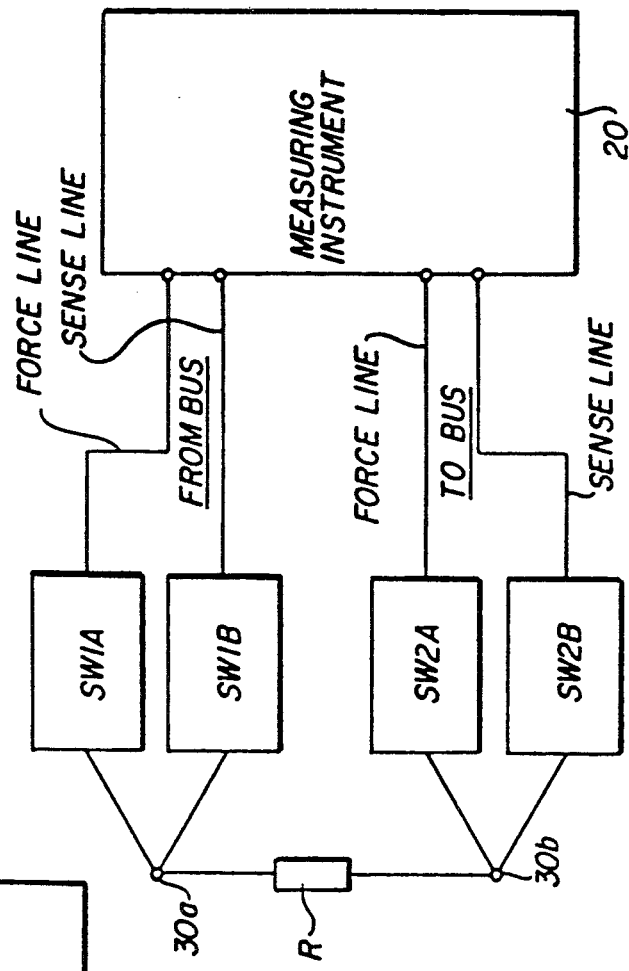
FIG. 4 is a block diagram of a typical prior art in-circuit tester.

A prior art solution to the problem is known as the Kelvin measurement, and is shown in the prior art circuit of FIG. 4. In the latter circuit, four switches are provided for each node point of the circuit board, so that each point can be connected either to the "TO" bus or to the "FROM" bus. When the resistance of resistor R is to be measured, the computer 16 of FIG. 1 causes the switch matrix 12 to close the four switches SW1A, SW1B, SW2A and SW2B. In this latter circuit, the measuring instrument 20 causes a known current to flow through switches SW1A and SW2A and through resistor R, so that a voltage appears across resistor R which is a function of the resistance of resistor R. This voltage is measured by the measuring instrument through the switches SW1B and SW2B, and no errors arise due to the internal resistance of the latter switches, because negligible current flows through those switches.

The measuring instrument 20 is connected to switches SW1A and SW2A through two "force lines", and the voltage is measured across two "sense lines" connected to switches SW1B and SW2B. The force and sense lines connected from the measuring instrument 20 to switches SW1A and SW1B are designated the "FROM" bus; and the force and sense lines connected from switches SW2A and SW2B to measuring instrument 20 form what is termed the "TO" bus.

Accordingly, in the testing equipment utilizing the prior art circuit of FIG. 4, four switches are required for each probe 30a and 30b, because each probe must be able to be connected to the "FROM" bus and also to the "TO" bus. Accordingly, for universal grid applications, a tester having, for example, 50,000 nails requires 200,000 switches.

Although the prior art circuits of FIGS. 3 and 4 assume only one component, namely a resistor R connected between the illustrated probes 30a and 30b; in actual practice, other resistors, or other components of the circuit board under test may also be connected to the probes. The circuit of FIG. 5 assumes three resistors R1, R2 and R3 connected to the probes 30a and 30b. The resistors R2 and R3 are also connected to the further probe 30c.

Figure 5:
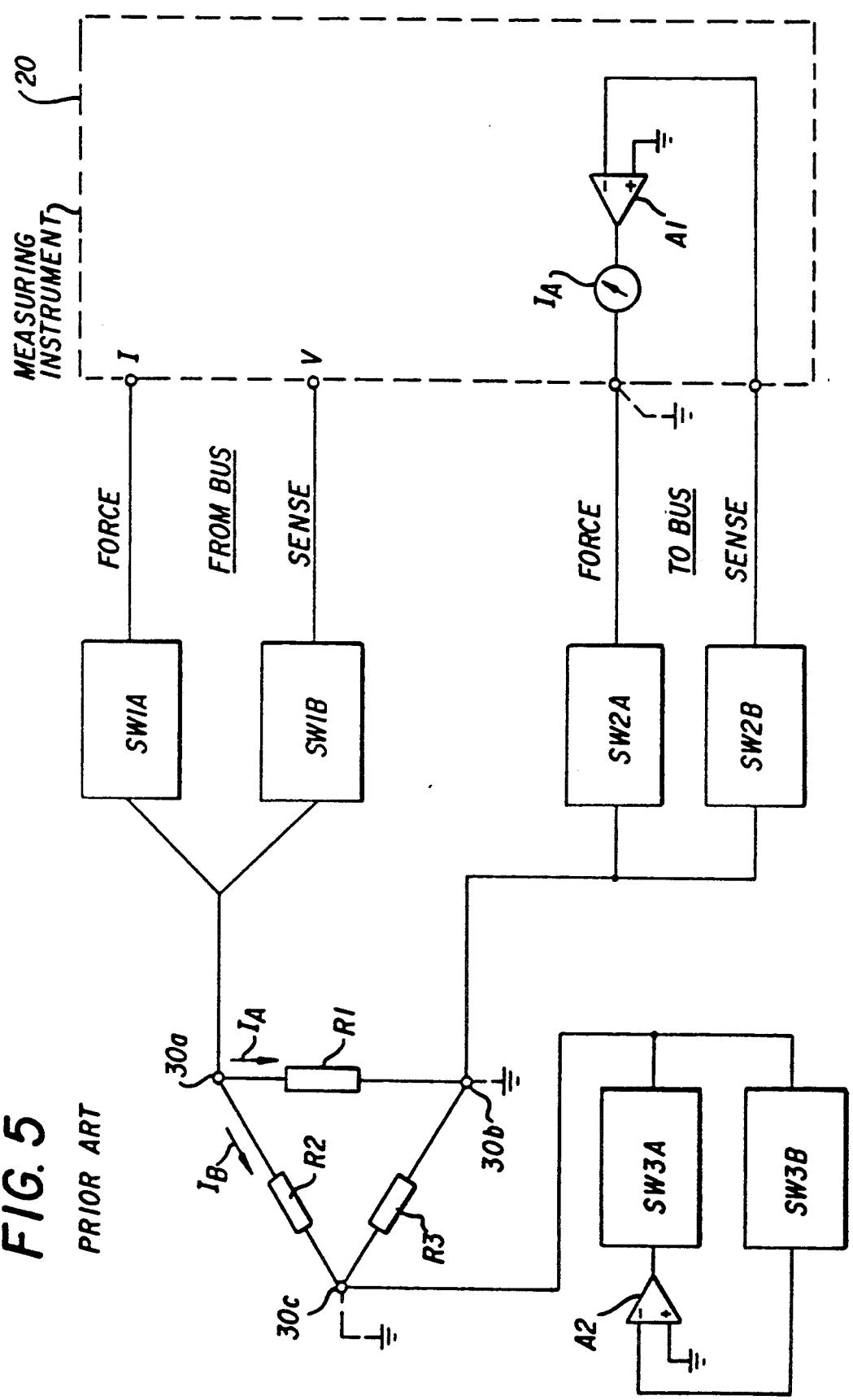
FIG. 5 is a circuit diagram showing a typical circuit used in the prior art in-circuit testers which includes physical guarding.

The prior art circuit of FIG. 5 includes switches SW1A, SW1B, SW2A and SW2B as in the preceding circuit. However, in addition, switches SW3A and SW3B are required selectively to provide a virtual ground at probe 30c for physical guarding purposes. Also, switch SW2A provides a virtual ground at probe 30b, also for guarding purposes. A virtual ground is provided at probe 30b by an operational amplifier A1 in the measuring instrument 20. The operational amplifier is connected so that any voltage appearing across switch SW2A is negative with respect to ground, and this causes the potential of the probe 30b to held at ground potential.

The probe 30c is established at virtual ground by an operational amplifier A2 which is connected through the switches SW3A and SW3B. When the switches SW3A and SW3B are closed, the operational amplifier A2 serves to establish the potential of the probe 30c at ground potential, thereby reducing the current through resistor R3 to zero. Accordingly, 50,000 operational amplifiers A2 would be required in the prior art example set forth above.

In the prior art circuit of FIG. 5, physical guarding is provided by controlling the switches SW1A, SW1B, SW2A, SW2B, SW3A and SW3B so that a virtual ground is provided at probes 30b and 30c. The force current I through the switch SW1A divides into currents IA and IB, and the portion IA of the current flowing through the resistor R1 which is measured by the tester is proportional to the voltage drop across the resistor R1, so that the voltage across the switches SW1B and SW2B may be measured to determine the actual resistance of the resistor R1. Accordingly, the resistance of the resistor R1 may be tested by the tester incorporating the circuit of FIG. 5.

A problem encountered in constructing testers incorporating the prior art circuit of FIG. 5, which utilizes physical guarding, is the fact that six switches are now required for each probe, which would result in the requirement of 300,000 switches in the 50,000 probe prior art universal grid tester referred to above. Also, the hardware implications of the prior art circuit of FIG. 5 do not lend themselves readily to computer programming, and the user must determine the points to be grounded on a manual basis.

Figure 6:
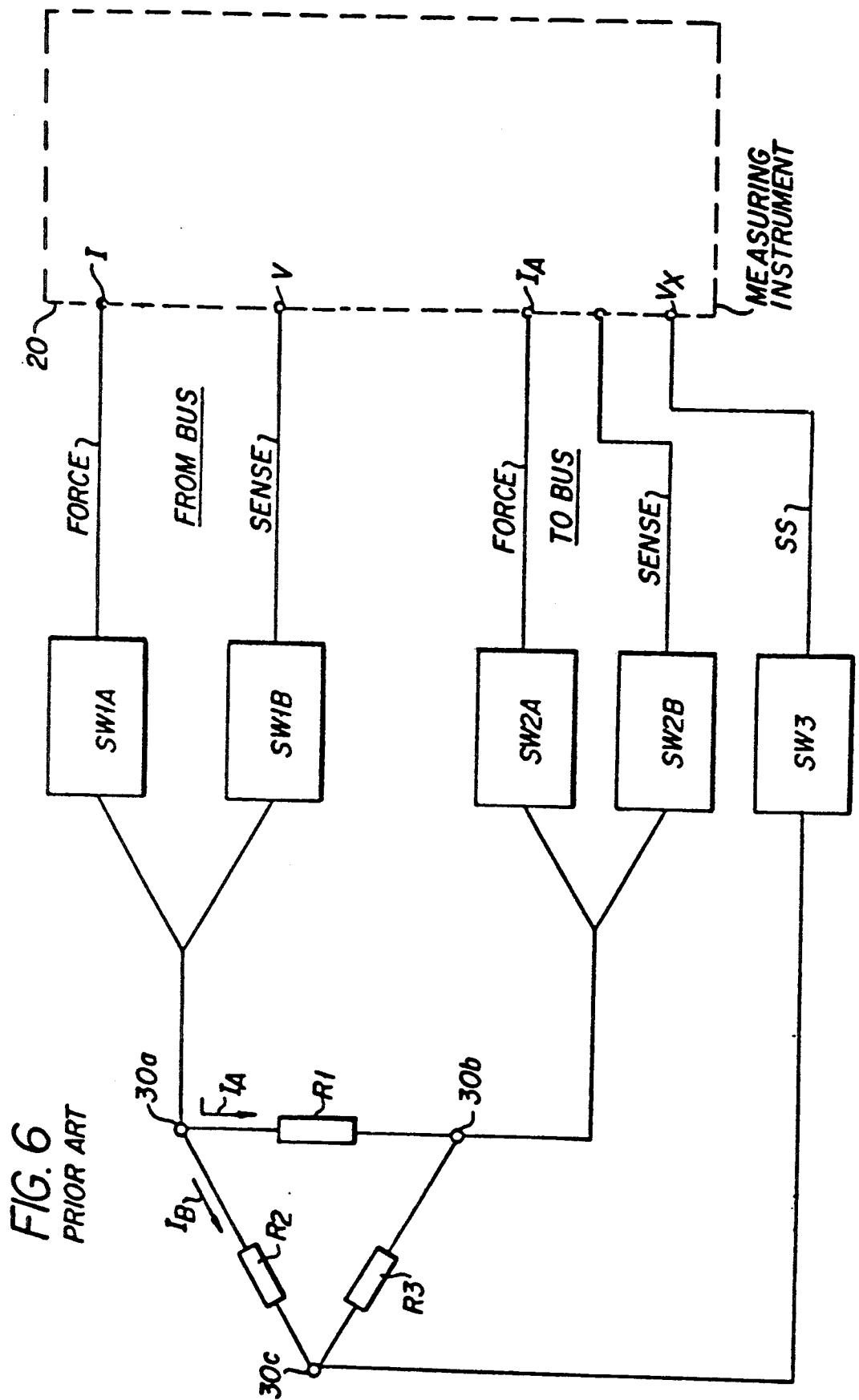
FIG. 6 is a circuit diagram used in another type of prior art tester in an attempt to eliminate guarding.

One prior art attempt to overcome the complexities of physical guarding, described in conjunction with the circuit of FIG. 5, is shown in FIG. 6. In the prior art circuit of FIG. 6, instead of attempting to create grounds at various test points, a third switch SW3 is provided which connects probe 30c to the measuring instrument.

In the prior art circuit of FIG. 6, the force current through switch SW1A splits through both sides of the network into currents IA and IB. Then, the computer included in the measuring instrument solves the various equations based on the voltages between the sense lines from switches SW1B and SW2B and between the sense lines from switch SW3 and switch SW2B, and the currents IA and IB, to determine the values of the resistors R1, R2 and R3. However, the illustrated circuit provides only two equations, and a third equation is required to determine R1, R2 and R3. This third equation may be obtained by reversing the poles of probes 30a and 30b. This technique is described in "Fault Diagnosis of Analog Circuits" by J. W. Bandler and A. E. Salama, Proceedings of the IEEE Vol. 73, No. 8, August 1985.

The computer 16 of FIG. 1 is caused to control the switches to reverse the connections to the probes 30a, 30b and 30c so that sufficient simultaneous equations are generated to permit the computer in the measuring instrument to solve for all the resistors R1, R2 and R3. However, the prior art circuit of FIG. 6 gives rise to virtually insurmountable complexities, when attempts are made to incorporate it into the large present-day testers, such as the 50,000 nail tester referred to above, in choosing the actual tests to be performed and in the cost of the large number of switches required.

Figure 7A:
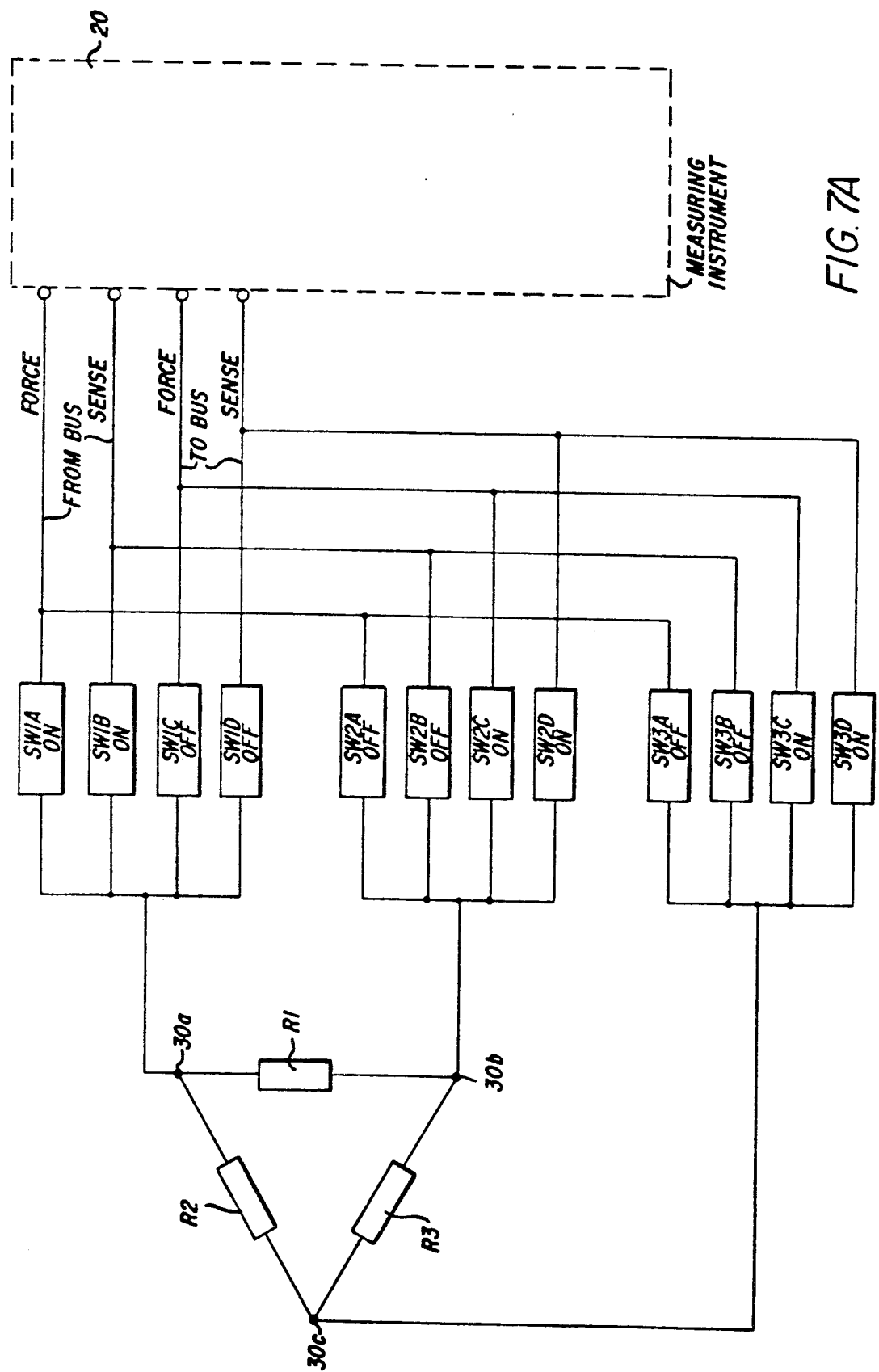
FIGS. 7A, 7B and 7C are circuit diagrams of the tester of the present invention showing three successive measurements which are made in accordance with the invention in order to test the entire circuit board.
Figure 7B:
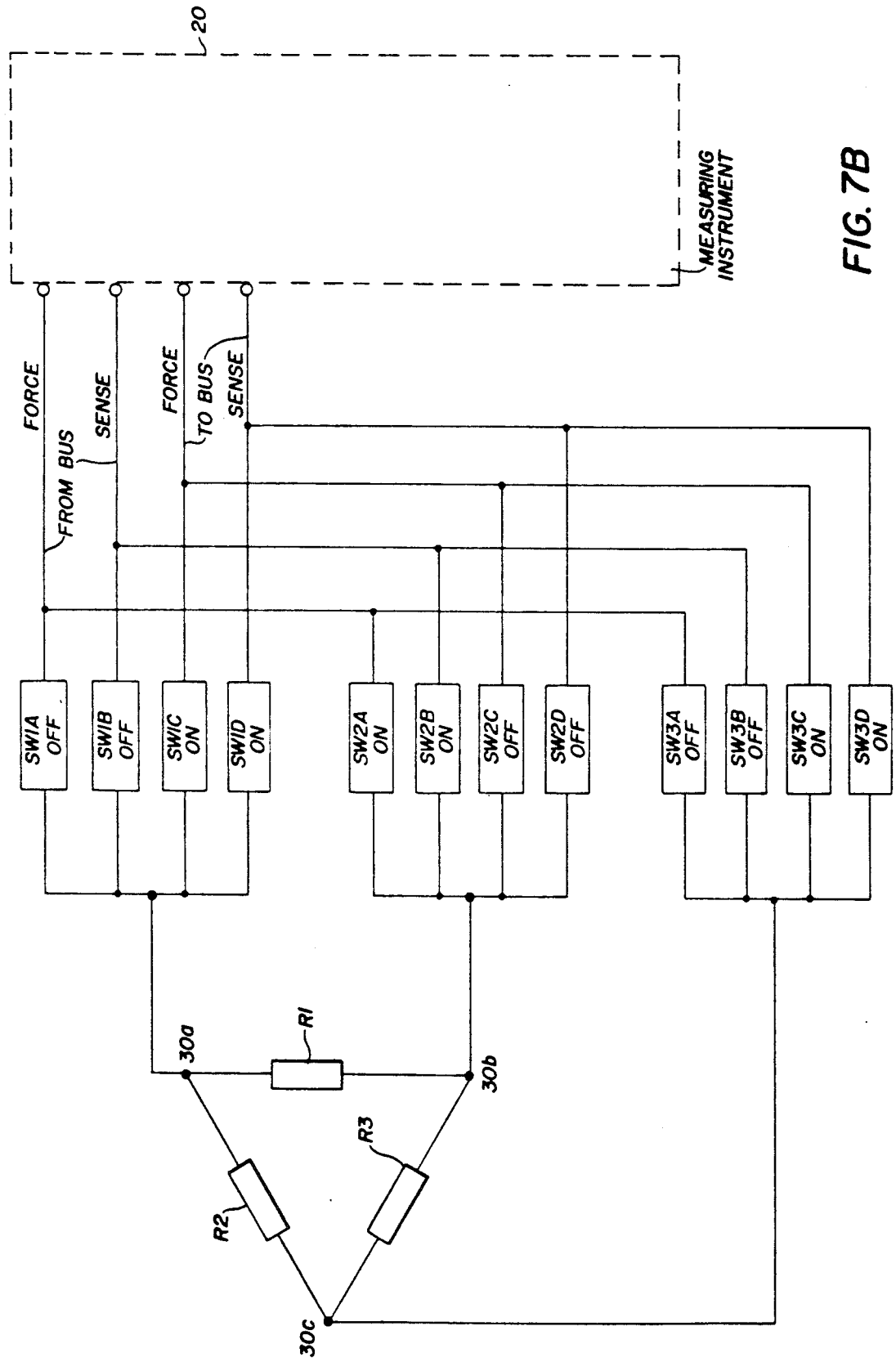
Figure 7C:
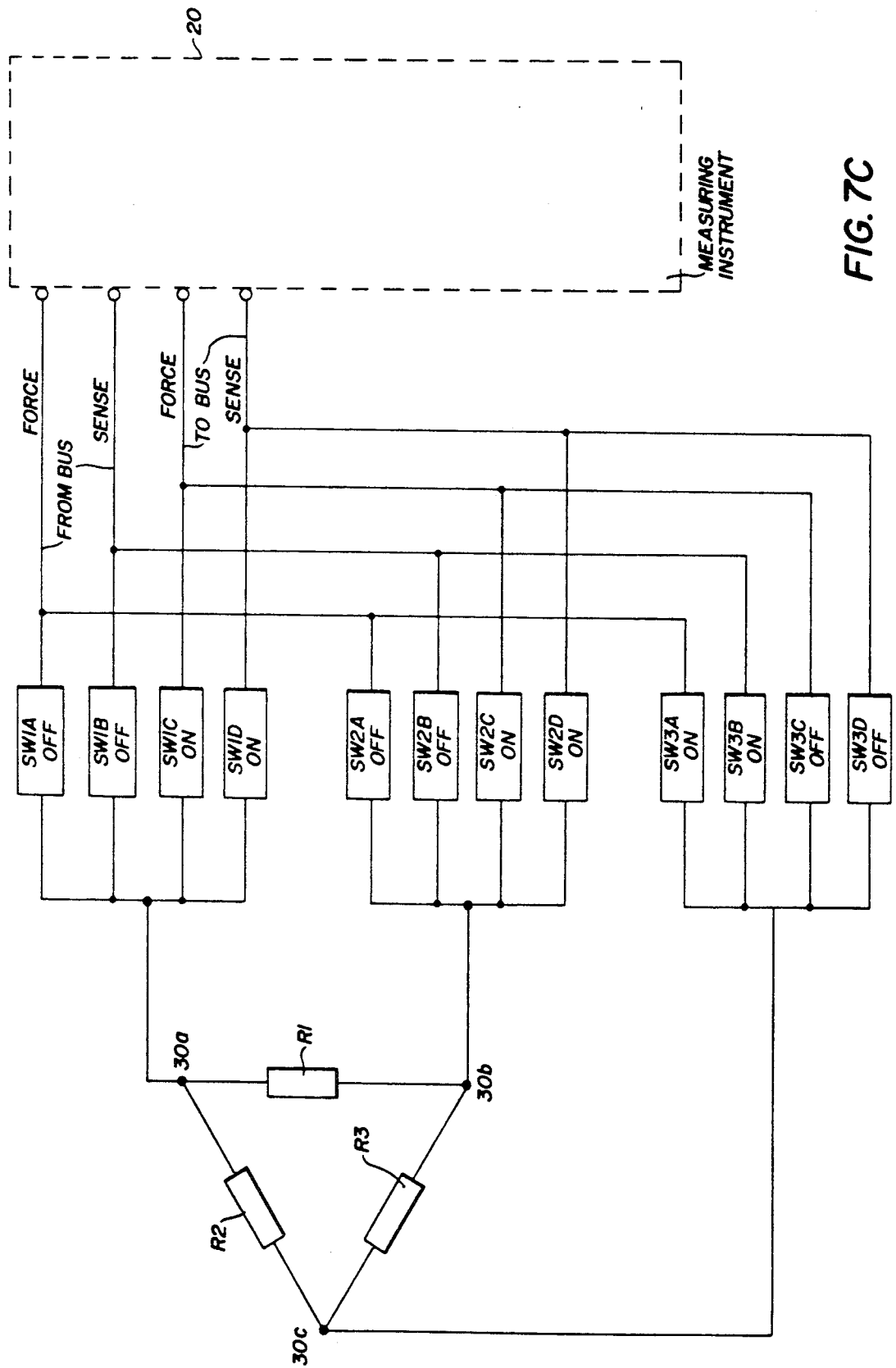

In the practice of the present invention, and as shown in FIGS. 7A, 7B and 7C, the three probes 30a, 30b and 30c are connected to the measuring instrument in three successive measuring steps, by closing the various switches illustrated in each circuit for each successive step, according to the on or off legends shown in each switch block in FIGS. 7A, 7B, 7C.

These successive steps correspond to a number of linear simultaneous equations which the computer 16 (FIG. 1) can solve. As many measuring steps are made as there are components of the printed circuit under test, and the testing apparatus of the invention has the capability of computing the values of all of the components of the printed circuit board, and of providing indications of such values at the completion of the test.

The testing apparatus of the invention has an advantage in that only four switches are required for each probe of the matrix. Also, it is a relatively simple matter to program a computer to assign the test points in the apparatus of the invention, so that the need for highly trained personnel in conducting the test is avoided.

The switch matrix 12 of FIGS. 1 and 1A serves to connect each of the many test points (nails) in the grid fixture 10 either to the FROM bus or to the TO bus, or to neither. Each test point, which physically contacts a particular node of the circuit under test, may be electrically connected by the switches, under the control of computer 16, to either bus.

It is important to the implementation, but not to understanding the principles of the present invention, to note that all connections from the measuring circuits to the test points are of the well-known Kelvin (or 2-terminal) kind. One connection to each test point is for current flow, and the other is for potential measurement. Thus, four switches are used for each test point. In FIG. 1A, the switches are designated TG0, TG1 and so on. The switches may be CMOS transmission gates of the kind commonly known as CD4066B or the equivalent.

In FIG. 1A, the switches are controlled by transparent latches U3A-U3D which may be 74HC75 or equivalent types. When the latch U3A connected to TG0 and TG1 is set, TG0 and TG1 are rendered conductive, and test point TP0 is said to be connected to the FROM bus. If the latch U3B connected to TG2 and TG3 is set, but the first-mentioned latch U3A is reset, test point TP0 is said to be connected to the TO bus.

The latches assume the state of the data (on/off) input when the latch enable (LE) is a logic 1. The computer 16 FIG. 1 may activate the latches independently by means of a plurality of decoders such as U1, which may be of the 74HC138 type, or activate the latches in groups by operating the FROM and TO group lines. The lines designated on/off, FROM group, TO group, FROM/TO, address, and strobe may be driven from a computer output port such as the well-known 82C55 type.

In the manner just described, the computer 16 may cause any one or a number of test points to be connected to the FROM bus and simultaneously any number of test points to be connected to the TO bus, while at the same time certain test points may be unconnected. Thus, the computer can cause the circuit under test to be connected to the measuring apparatus in any of all possible ways for each successive measurement, without the need to physically move or reconnect the article under test.

Figure 8B:
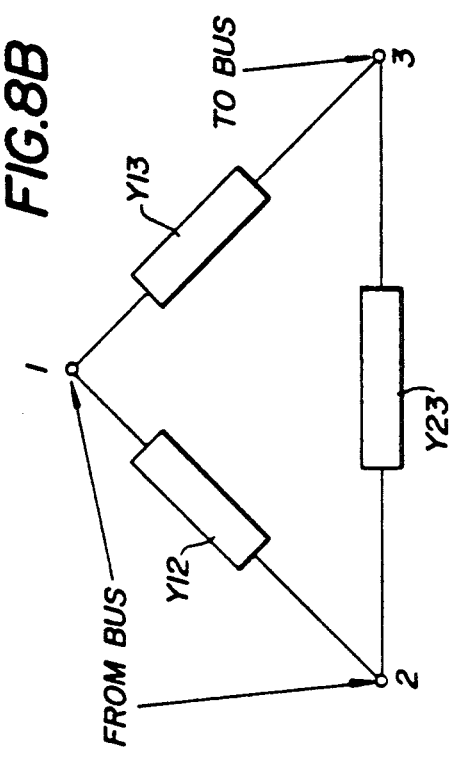
FIGS. 8A, 8B and 8C are schematic diagrams of the connections made to the circuit board for each of the three measurements of FIGS. 7A, 7B, 7C.
Figure 8A:
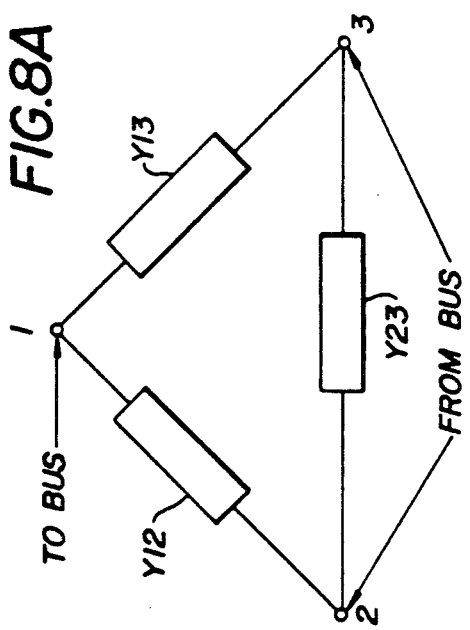
Figure 8C:
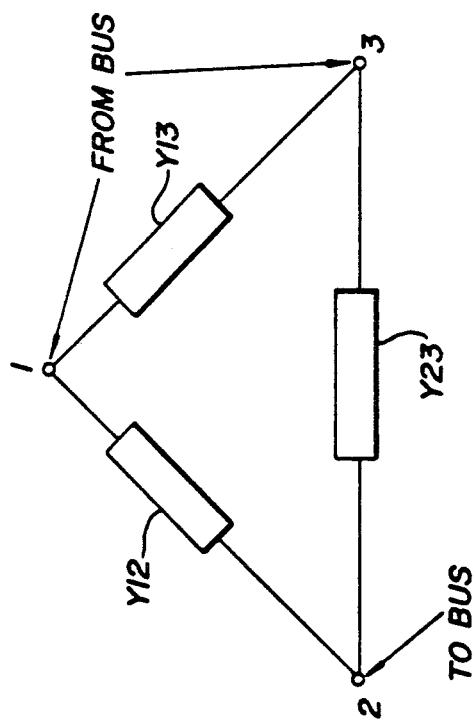

The measurements by the testing apparatus of invention comprise measuring the complex admittances (Y) of the various node combinations of the printed circuit unit under test. The switching is such that simple linear simultaneous equations may be derived. FIGS. 8A, 8B and 8C show schematically one manner in which appropriate measurements are made. It should be noted that the circuits of FIGS. 8A, 8B and 8C correspond to the circuits of 7A, 7B and 7C, although the notation is different to facilitate the mathematical description. Also the role of the "TO" bus and "FROM" bus has been reversed to illustrated such a possibility.

For the first measurement of the matrix, and as shown in FIG. 8A, Point 1 is connected to the "TO" bus, and Point 2 and 3 are connected to the "FROM" bus, so that Y23 is short circuited. Then, the first measurement (M23) is taken between the "TO" and "FROM" buses, and:

$$M23 = Y12 + Y13.$$

For the second measurement (FIG. 8B), point 3 is connected to the "TO" bus and Points 1 and 2 are connected to the "FROM" bus, so that Y12 is short circuited. Then, the second measurement (M12) is taken between the "TO" and "FROM" buses, and:

$$M12 = Y13 + Y23.$$

For the third measurement (FIG. 8C), Point 2 is connected to the "TO" bus and, Points 1 and 3 are connected to the "FROM" bus, so that Y13 is short circuited. Then, the third measurement (M13) is taken between the "TO" and "FROM" buses, and:

$$M13 = Y12 + Y23.$$

Accordingly:

$$Y12 = \tfrac{1}{2}[M23 - M12 + M13]$$

$$Y13 = \tfrac{1}{2}[M23 + M12 - M13]$$

$$Y23 = \tfrac{1}{2}[-M23 + M12 + M13]$$

Thus, there are three linear simultaneous equations and three unknowns, and these are readily solved by the computer 16 of FIG. 1, so that the individual admittances may be determined.

Figure 9:
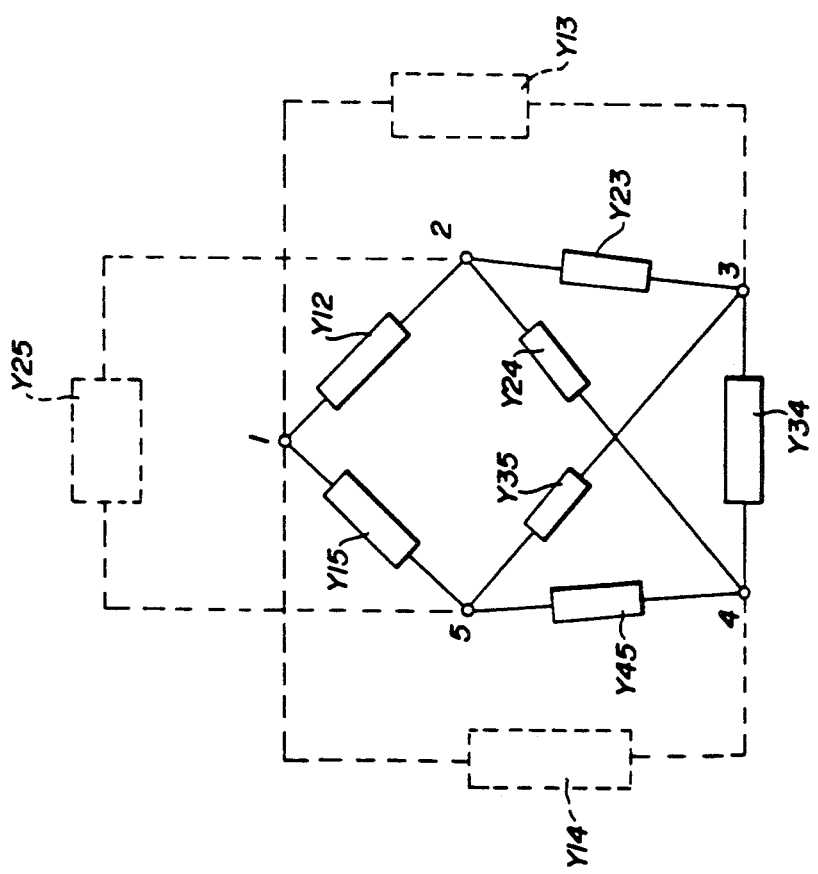

A more complex network is shown in FIG. 9 which has the following test equations:

$$M12 = Y13 + Y14 + Y15 + Y23 + Y24 + Y25$$

$$M13 = Y12 + Y14 + Y15 + Y23 + Y34 + Y35$$

$$M14 = Y12 + Y13 + Y15 + Y24 + Y34 + Y45$$

$$M15 = Y12 + Y13 + Y14 + Y25 + Y35 + Y45$$

$$M23 = Y12 + Y13 + Y24 + Y25 + Y34 + Y35$$

$$M24 = Y12 + Y14 + Y23 + Y25 + Y34 + Y45$$

$$M25 = Y12 + Y15 + Y23 + Y24 + Y35 + Y45$$

$$M34 = Y13 + Y14 + Y23 + Y24 + Y35 + Y45$$

$$M35 = Y13 + Y15 + Y23 + Y25 + Y34 + Y45$$

$$M45 = Y14 + Y15 + Y24 + Y25 + Y34 + Y35$$

These equations may be represented in matrix form as:

$$M = AY$$

Where:
M is the vector (M1, M13 ... M45),
Y is the vector (Y12, Y13 ... Y45), and
A is the 10 x 10 adjacency matrix for the network.

Given the measurements M made by measuring instrument 20 under the control of computer 16, the component values Y can be determined using $Y = A - 1M$.

Figure 10:
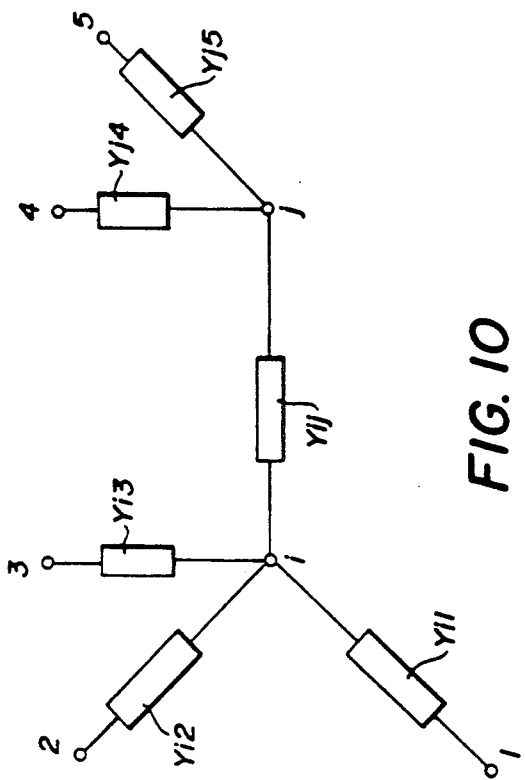
FIGS. 9 and 10 are other diagrams showing additional measuring techniques.

Another measuring scheme is shown in FIG. 10. The measuring scheme of FIG. 10 requires more measurements than the forms described above, and it increases the test time slightly. However, it requires less computational effort since large systems of equations do not need to be solved. In the scheme of FIG. 10, each component value is computed individually.

For example, in order to measure Yij, three measurements are taken, namely:

"Mi"—in which the "TO" bus is connected to the probes 1, 2, 3 and j; and the "FROM" bus is connected to probe i;

"Mj"—in which the "TO" bus is connected to probes i, 4 and 5; and the "FROM" bus is connected to probe j;

"Mij"—in which the "TO" bus is connected to probes 1 2, 3, 4 and 5; and the "FROM" bus is connected to probes i, j.

These three measurements provide the following equations:

$$M_i = Yi1 + Yi2 + Yi3 + Yij$$

$$M_j = Yj4 + Yj5 + Yij$$

$$Mij = Yi1 + Yi2 + Yi3 + Yj4 + Yj5$$

The computer in measuring instrument 20 of FIG. 1 can then determine the value Yij by the following computation:

$$Yij = \tfrac{1}{2}[M_i + M_j - Mij]$$

In like manner, the other admittances Yi1, Yi2, Yi3, Yj4, Yj5 may be measured.

Due to the limited number of significant digits produced by the measuring instrument 20 of FIG. 1, it may be desirable to use higher order virtual nodes. In these cases, multiple components are shorted in some of the measurements. For example, Yij and Yjk may be tied to the "FROM" bus and all other points to the "TO" bus (Common). This forms the measurement Mijk. Equations analogous to the one previously derived for Yij can be formed in terms of higher order virtual nodes and may have better accuracy. The availability of a component list and measurement values allows the tester to make decisions about using higher order measurements without human intervention.

The following discussion is directed to appropriate software derived from program store 18 and introduced to computer 16 to provide a control means for controlling switch matrix 12 of FIG. 1. The software uses a pseudo-code that is based on the programming language Ada. Ada is defined in the Reference Manual for the Ada Programming Language (ANSI/MIL-STD-1815A-1983).

The system software interacts with the switch matrix 12 using the procedure switch, which has four manifestations:

switch(address, to, on);
switch(address, to, off);
switch(address, from, on);
switch(address, from, off).

For example, executing switch (address, to, on) loads the computer's output port that is connected to the 75HC138 decoders with "address", sets FROM/TO to ON/OFF on, and then STROBES. The result is that the switch named by "address" is connected to the TO bus. The other three manifestations operate in an analogous fashion.

The function measure instructs the measuring apparatus to measure and return the complex admittance between the TO and FROM busses. By setting he busses appropriately, the system software can determine the admittance between any two groups of test points.

All switching and measurement is controlled by a test program. Such a program is constructed by an algorithm based on information supplied about the article under test. Once the test program is available for a particular article, it can be interpreted by another algorithm which performs switching/measurement, computes component values using mathematical guarding, checks computed values against expected values, and reports any errors. A total of three algorithms are presented: (1) test program construction for the first form of mathematical guarding; (2) testing using the first form or mathematical guarding; and (3) testing using the second form of mathematical guarding (test program construction is not required for the second form).

For clarity, the remainder of this discussion will assume that all components have two leads, although the present invention is not limited to two-lead components.

Components are numbered starting at one, and the function lastComponent returns the number of components. For FIG. 6, lastComponent = 3. The expected value of a component consists of two values each with a positive and negative tolerance. The first value corresponds to the real part of the component's nominal admittance and the second value corresponds to the imaginary part of its nominal admittance. Using complex numbers allows the software to test arbitrary passive-linear components (resistors, capacitors and inductors). The procedure setValue(i, re, rePlus, reMinus, im, imPlus, imMinus) saves the value of component "i". Component values can be entered by the operator, read in from a file, or computed by either of the mathematical guarding test algorithms. The latter allows the test system to "learn" component values from articles that are known to operate properly. The values defaultrePlus, default reMinus, defaultimPlus, and defaultimMinus are chosen by the test system operator to provide suitable default tolerances when component values are "learned". The functions re(i), rePlus (i), reMinus (i), im(i) imPlus (i) and imMinus(i) return the previously set real part, real part plus tolerance, real part minus tolerance, imaginary part, imaginary part plus tolerance, imaginary part, imaginary part plus tolerance, and imaginary part minus tolerance for the component numbered "i".

The function value OK (i, computedValue) returns true if "computedValue" (a complex number) is within tolerance for the component numbered "i", and false otherwise. A "computedValue" having a real part denoted re(cv) and an imaginary part denoted im(cv) is said to be within tolerance for a component "i" if and only if:

a. re(i)*(1-reMinus(i)) < = re(cv) < = re(i)* (1 + rePlus(i)) and
 b. im(i)*(1-imMinus(i)) < = im(cv) < = im(i)* (1 + imPlus(i)).

The first form of mathematical guarding is restricted to circuits that have 3 nodes or more than 4 nodes (i.e. circuits with 1, 2 or 4 nodes are illegal). Furthermore, it treats partially connected circuits as fully connected circuits by "testing" components that are not physically present. This insures adjacency matrix invertibility but has no effect on computed component values. A single pin address must be specified for each node in the circuit, also a node name should be specified for each node to assist the operator in locating faults. This information can be represented for FIG. 6 as:

(node "30a" 1)
(node "30b" 2)
(node "30c" 3)

Like components, nodes are numbered starting at one end and the function lastNode return the number of nodes. The function location(i) returns the pin address for the ith node. A fully connected network with lastNode nodes contains exactly lastNode *(lastNode − 1)/2 components. The function Asize returns this value, which incidentally, is equal to last component when using the first form of mathematical guarding. Given two node numbers i,j with i<j, let cn(i,j) return the number of the component between the nodes "i" and "j" (Components are two-leaded and at most one component can exist between any two circuit nodes. If two or more components exist between the same two nodes, mathematical guarding treats them as a single component.) Cn(i,j) is a one to one, increasing mapping from positive i,j to the range 1 ... Asize for i<j. Let Cninv(n,i,j) be Cn(i,j)'s inverse, i.e. it takes an "n" and returns the smallest "i" and "j" such that n=Cn(i,j) and i<j. Such a mapping for Asize=10 is 1:1,2 2:1,3 3:1,4 4:1,5 5:2,3 6:2,4 7:2,5 8:3,4 9:3,5 10:4,5.

A test program for the first form consists of the above node data plus its corresponding inverted adjacency matrix, denoted Ainv. Algorithm 1 computes Ainv given the node data:

```
Algorithm 1:

A,Ainv       :array (1..Asize, 1..Asize) of float;
procedure MG1generate is
mi, mj, ni, nj    : positive,
begin
--Generate A (note that A is symmetric)
for m in 1..Asize loop
  Cninv(m, mi, mj);
  for n in m+1..Asize loop
    Cninv(n, ni,nj);
    --If component n is directly connected to component m then
    --mark A with a 1, otherwise mark it with a 0
    if (mi = ni) or (mj = nj) or (mj = ni) or (mj = nj) then
      A(m, n): = 1.0;
      A(n, m): = 1.0;
    else
      A(m, n): = 0.0;
      A(n, m): = 0.0;
    end if
  end loop;
end loop;
--Zero A's diagonal (if it was never accessed by the
--two loops)
for m in 1..Asize loop
  A(m, m): = 0.0;
end loop;
--Invert A to produce Ainv
Ainv: = A**(-1);
end MG1generate;
```

Figure 11:
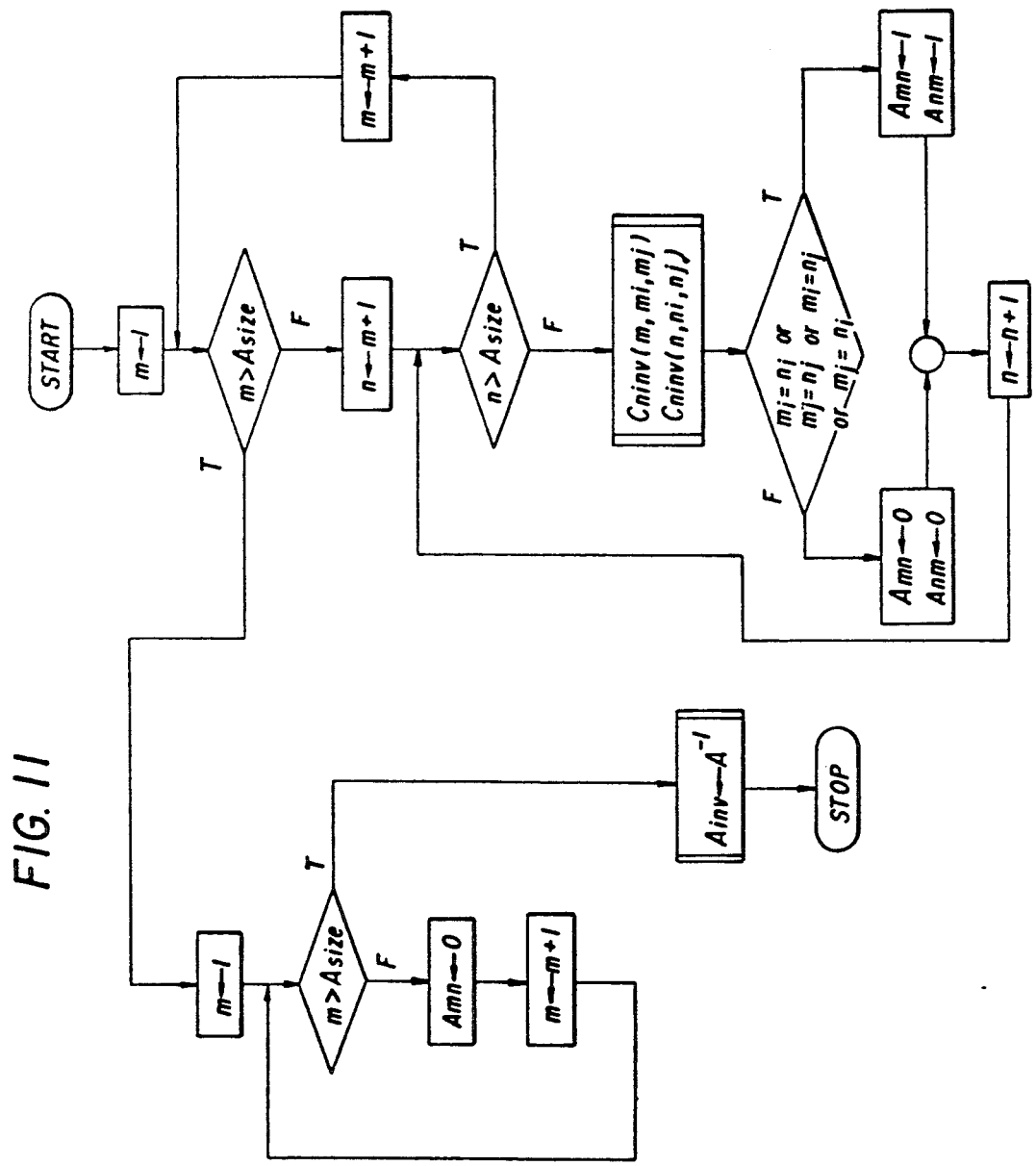
FIGS. 11, 12 and 13 are flow charts of certain algorithms described in the specification.

The final step in Algorithm 1 is the inversion of the adjacency matrix to produce Ainv. This may be accomplished by any number of several well known numerical matrix inversion techniques, such as Guassian Elimination with Maximal Column Pivoting as described in Numerical Analysis, 2nd Edition, by Burden, Faires and Reynolds (1981, Prindle, Weber & Schmidt, Boston), FIG. 11 is a flow chart of Algorithm 1 which computes and inverts the adjacency matrix of an electric circuit.

Algorithm 2 uses the node data and Ainv computed by Algorithm 1 to either "learn" component values from an article known to operate properly or to test an article.

```
Algorithm 2:

procedure MG1test(set-Values:boolean) is
m, cv    :array(1..Asize) of complex;
k        :positive:=1;
begin
--Set TO bus to common (all switches are assumed to be off)
for in 1..last-Node loop
  switch(location(i), to, on);
```

```
Algorithm 2:
-continued end loop;
--Perform all possible measurements between nodes i,j (i j)
--and common for i in 1..last-Node loop
--Switch location(i) from TO bus to FROM bus
switch(location(i), to, off);
switch(location(i), from on);
for j in i+1..last-Node loop
  --Ditto for location(j)
  switch(location(j), to, off);
  switch(location(j), from, on);
  m(k):=measure;
  k :=k + 1;
  --Restore location(j) to common
  switch(location(j), from, off);
  switch(location (j), to, on);
end loop;
switch(location(i), from, off);
switch(location(i), to, on);
end loop;
--Component values are computed by multiplying Ainv by the
measurement
--measurements vector (m) using complex matrix arithmetic.
cv := Ainv*m;
--Set or check component values
for i in 1..A-size loop
  --(last-component = A-size)
  if set-Values then
    set-Value(i,re(cv(i)), defaultrePlus, defaultreMinus,
    im(cv(i)), defaultimPlus, defaultimMinus),
  else
    if not value-OK(i,cv(i)) then
      --Report error to operator, include both node names,
      --expected component value and computed component value
      report-error;
    end if;
  end if;
end loop;
end MG1test;
```

Figure 12:
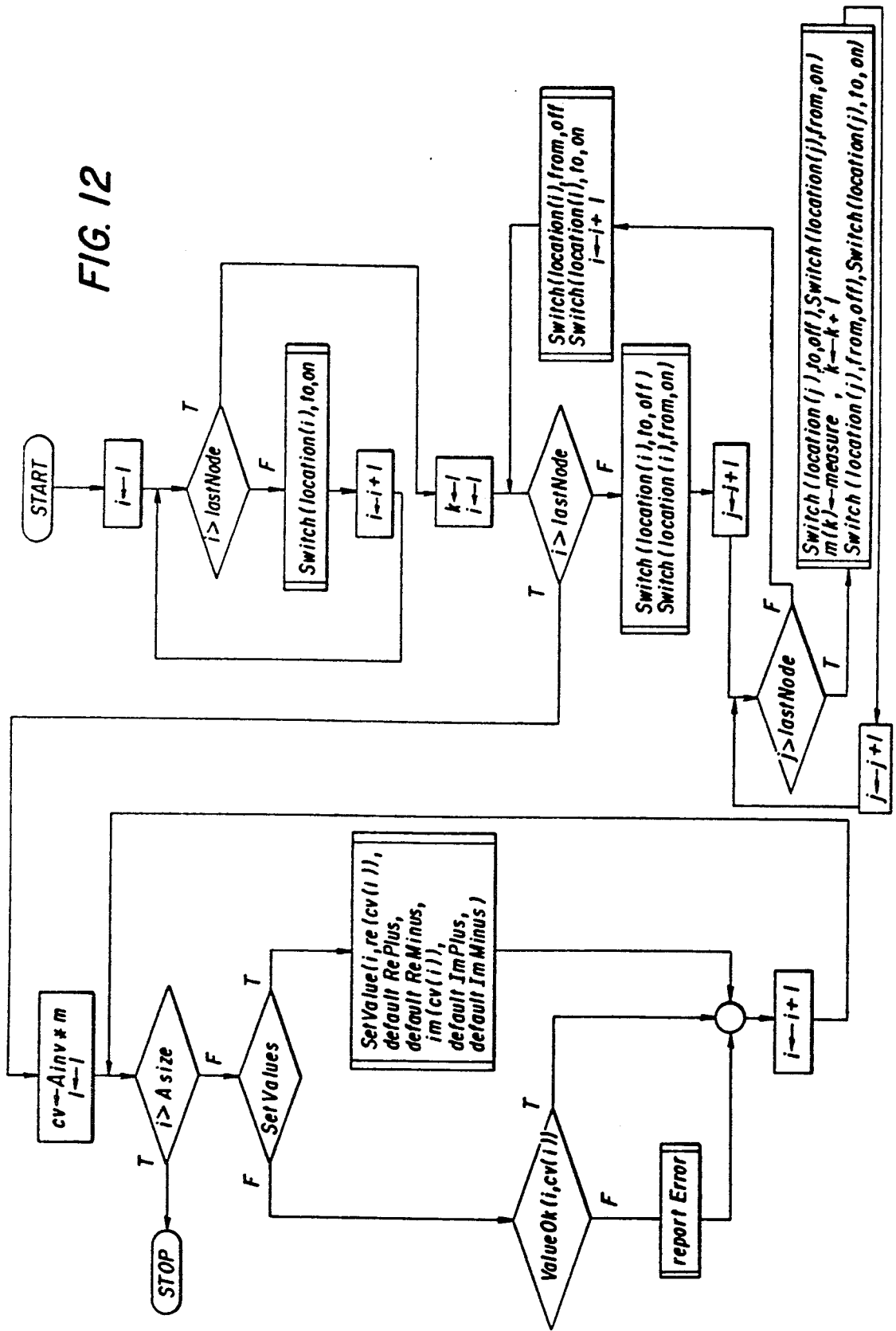

FIG. 12 is a flow chart of Algorithm 2 which performs admittance measurements and computes component values using the inverted matrix generated by Algorithm 2.

The second form of mathematical guarding is unrestricted and only requires a list of components to test and the address of the test points connected to each components leads. This information can be represented as:

(component "R1" 1 2)
(component "R2" 1 3)
(component "R3" 2 3)

where test point 1 connects to 30a, 2 to 30b, and 3 to 30c. The test program construction Algorithm for the second form of mathematical guarding is primarily concerned with test program optimization and other matters that are not relevant to the current specification. As such, the above representation can be used directly as a simplified test program.

Assume each component is numbered is ascending order so that R1 is component 1, R2 is component 2, and R3 is component 3. The function location(i,j) returns the jth pin of the ith component. For example, location (3,1)=2. Algorithm 3 is the test algorithm for the second form of mathematical guarding.

```
Algorithm 3 procedure MG2test(set-Values:boolean) is
m1, m2, m12, cv     :complex;
begin
--set TO bus to common (all switches are assumed to be off)
for i in 1..last-component loop
  switch(location (i,1), to, on);
```

-continued

Algorithm 3:

```
switch(location i,2), to, on);
--Note: setting the same switch to the TO bus twice causes no
difficulties, it is just slight inefficient
end loop;
--Consider each component in turn
for i in 1..last-component loop
--First measurement
switch(location(i,1), to, off); --Remove from common
switch(location(i,1), from, on); --tie to other bus and
measure
m1: = measure;
switch(location(i,1), from, off); --Restore previous state
switch(location(i,1), to, on);
--Second measurement
switch(location(i,2), to, off); --Remove from common
switch(location(i,2), from, on);
m2 := measure;
--Third measurement
switch(location(i,1), to, off); --Remove from common
switch(location(i,1), from, on);
--location(i,1) and location (i,2) now tied to FROM bus
m12: = measure
switch(location(i,1), from, off) --Restore to common
switch(location(i,1), to, on);
switch(location(i,2), from, off);
switch(location(i,2), to, on).
--Compute component value using the second form of
mathematical guarding with complex arithmetic.
cv: = 0.5*(m1 - m2 - m12);
--Set Value or check value?
if set-Values then
set-Value(i,re(cv), defaultrePlus, defaultreMinus,
im(cv), defaultimPlus, defaultimMinus);
else
--Check value
if not value-OK(i, cv) then
--Report error to operator, include component's name.
--expected value and computed value
report-error;
end;
end if;
end loop;
end MG2test;
```

Figure 13:
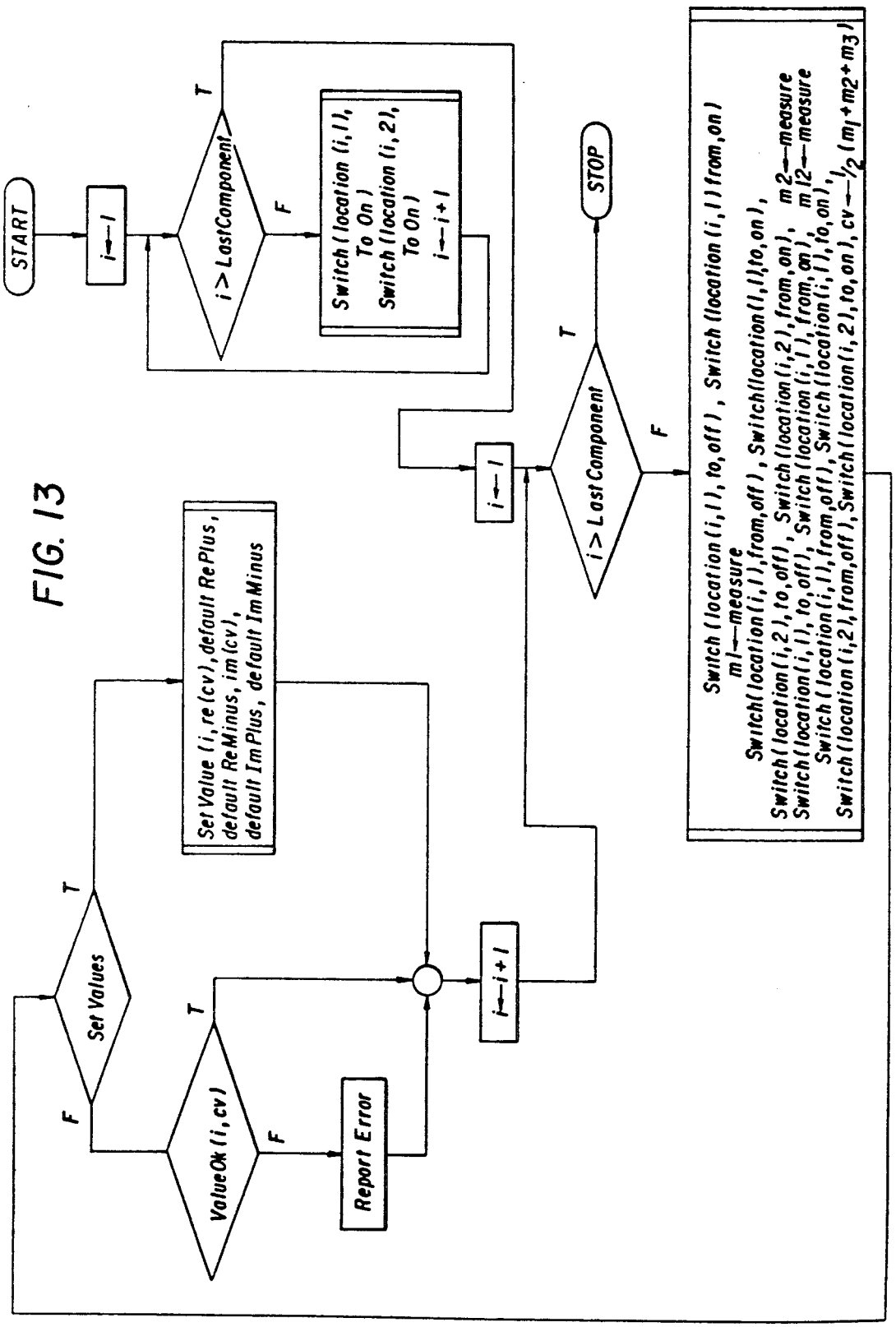

FIG. 13 is a flow chart of Algorithm 3, which also performs measurements and computes component values, but uses calculations that are different from Algorithms 1 and 2.

It should be noted that the invention can operate using either form of mathematical guarding and that the selection of an appropriate form is based on factors beyond the scope of this specification.

Each line of algorithms 1-3 is required to implement some aspect of mathematical guarding. The actual mathematic guarding equations are set forth above. The following description of the algorithms is intended to clarify the implementation of mathematical guarding.

Two forms of mathematical guarding have been presented. The first form builds an adjacency matrix A based on the net list describing the article under test. The inverse of this matrix is then multiplied by a measurement vector M to yield component values Y. Algorithm 1 (FIG. 11) builds A and computes its inverse. Algorithm 2 (FIG. 12) controls the switch matrix and measuring apparatus to determine the elements of M. The switch settings are crucial to the operation of both forms of mathematical guarding. Once the component values Y are computed, algorithm 2 either "sets" the values or compares the values against previously set values. This behavior is controlled by the parameter setValues passed to algorithm 2. This requires further explanation. Assume we have an article whose components are known to have the correct values. Perhaps the article was removed from a working system. Algorithm 2 can compute the component values based on the measurements M and remember, i.e. "set", the values for later reference. Now suppose we have another article that may have components with incorrect values. Algorithm 2 can compute the component values for this new article, and then check to see if the values are close to the previously remembered values. If a particular value is not close, i.e. out of tolerance, then the corresponding component is reported as an error.

The second form, or scheme, of mathematical guarding effectively replaces the adjacency matrix with additional measurements. Hence, it trades measurement effort for computational effort. Since the second form does not use the adjacency matrix A, it can be completely described by a single algorithm (FIG. 13). For each component on the component list, algorithm 3 makes three measurements and computes the component's value. Again, the switch settings that define the measurements are crucial. Then, just like algorithm 2, the value is either "set" or compared against a previously set value for the component.

The operator may select which form of mathematical guarding is used. The first form requires the execution of Algorithms 1 and 2, and the second form requires the execution of Algorithm 3. The operator's choice may be based on tradeoffs between test time and computation time, the desired accuracy of computed component value, and other factors beyond the scope of this specification. It should be noted that Algorithms 1-3 precisely define which measurements are performed. It would be simple to modify the algorithms to produce a list of measurements in human readable form instead of actually performing the measurements.

It should be noted that the system of the invention is not limited to vacuum systems or universal grids. Other types of systems, such as pneumatic, are acceptable and some users may use dedicated fixturing.

The invention provides therefore, a board assembly tester which uses mathematical rather than physical guarding for reducing the complexity of the tester, for simplifying its operation, and for increasing its accuracy and efficiency.

It will be appreciated that while particular embodiments of the invention have been shown and described, modifications may be made, and it is intended in the following claims to cover all embodiments which fall within the true spirit and scope of the invention.

We claim:

1. Testing apparatus for establishing electrical connections to test points on an assembled printed circuit board having electrical components connected to said test points and for measuring the values of the electrical components on said printed circuit board, said testing apparatus including: a measuring instrument; a "TO" bus and a "FROM" bus connected to said measuring instrument; a switch matrix including a plurality of switches respectively connected to the "TO" bus and to the "FROM" bus and adapted to be connected to each of said test point selectively to connect said measuring instrument to said test point; control means connected to the switches in said switch matrix to open and close the switches in accordance with a predetermined program to cause the measuring instrument to be connected to different ones of the test points in each of a multiplicity of groups of at least three of said test points in each of a predetermined number of measuring steps for each of said groups to cause said measuring instrument to derive a number of linear simultaneous equations corresponding to the number of measuring steps; and a computer included in said measuring instrument for solving the simultaneous equations and thereby to determine the value of each of the components connected to the test points of each of said groups.

2. The apparatus defined in claim 1, in which said measuring instrument measures the complex admittance (Y) of the different component combinations for each measuring step so that simple linear simultaneous equations may be derived.

3. The apparatus defined in claim 1, in which said control means includes a further computer programmed to establish the required switching operations in said switch matrix for each measuring step in each of the plurality of measuring operations.

4. A method for establishing electrical connections to test points on an assembled printed circuit board having electrical components connected to the test points and for measuring the values of the components by a measuring instrument having a "TO" bus and a "FROM" bus and which comprises the following steps: selectively connecting the "TO" bus and the "FROM" bus of the measuring instrument to different ones of said test points in each of a multiplicity of groups of at least three of said test points in each of a predetermined number of measuring steps for each of said groups to derive a number of linear simultaneous equations corresponding to the number of measuring steps; and solving the simultaneous equations to determine the value of each of the components connected to the test points of each of said groups.

5. The method defined in claim 4, in which the complex admittances of different component combinations are measured during each measuring step so that simple linear simultaneous equations may be derived.

* * * * *